United States Patent [19]
Yoshida

[11] Patent Number: 5,009,719
[45] Date of Patent: Apr. 23, 1991

[54] TANDEM SOLAR CELL

[75] Inventor: Susumu Yoshida, Hyogo, Japan

[73] Assignee: Mitsubishi Denki Kabushiki Kaisha, Japan

[21] Appl. No.: 433,278

[22] Filed: Nov. 8, 1989

[30] Foreign Application Priority Data

Feb. 17, 1989 [JP] Japan .................................. 1-38691

[51] Int. Cl.$^5$ .......................................... H01L 31/068
[52] U.S. Cl. ........................................ 136/249; 357/30
[58] Field of Search ................. 136/249 TJ; 357/30 J

[56]  References Cited

U.S. PATENT DOCUMENTS

| 4,575,577 | 3/1986 | Fraas | 136/249 TJ |
| 4,631,352 | 12/1986 | Daud et al. | 136/249 TJ |
| 4,680,422 | 7/1987 | Stanbery | 136/249 TJ |
| 4,681,982 | 7/1987 | Yoshida | 136/249 |
| 4,867,801 | 9/1989 | Stanbery | 136/249 TJ |

FOREIGN PATENT DOCUMENTS

| 57-1268 | 1/1982 | Japan | 136/249 |
| 58-119676 | 7/1983 | Japan | 136/249 |
| 58-119679 | 7/1983 | Japan | 136/249 |
| 58-127386 | 7/1985 | Japan | 136/249 TJ |
| 62-14110 | 3/1987 | Japan | 136/249 |

OTHER PUBLICATIONS

L. M. Fraas et al., *Conference Record, 16th IEEE Photovoltaic Specialists Conference* (1982), pp. 655-662.

S. M. Vernon et al., *Conference Record, 17th IEEE Photovoltaic Specialists Conference* (1984), pp. 434-439.

H. C. Hamaker, *Conference Record, 18th IEEE Photovoltaic Specialists Conference* (1985), pp. 140-145.

"High Efficiency AlGaAs/GaAs Tandem Solar Cells Grown by Molecular Beam", *Int'l PVSEC-3*, pp. 772-774.

*Primary Examiner*—Aaron Weisstuch
*Attorney, Agent, or Firm*—Leydig, Voit & Mayer

[57]  ABSTRACT

A tandem solar cell device includes an upper solar cell, a lower solar cell, and an intervening buffer layer. A short wavelength region of the incident light is absorbed by the upper solar cell while the light having passed through the upper solar cell is absorbed by the lower solar cell. The buffer layer is a semiconductor layer having a larger band gap energy than the upper solar cell, a crystalline lattice match with the upper solar cell, and a tunnel junction.

9 Claims, 4 Drawing Sheets

TANDEM SOLAR CELL

FIELD OF THE INVENTION

The present invention relates to a tandem solar cell device and, more particularly, to a buffer layer inserted between solar cells of a tandem solar cell device including different kinds of solar cells.

BACKGROUND OF THE INVENTION

A tandem structure solar cell device comprising a GaAs solar cell serially disposed on a Si solar cell utilizes solar light more effectively than either a Si solar cell or a GaAs solar cell alone.

FIG. 2 is a cross-sectional view of a prior art tandem solar cell device. In FIG. 2, a Si solar cell (lower solar cell) 10 includes an n-type Si substrate 11 about 100 to 200 microns thick and a p-type Si layer 12 less than 1 micron thick disposed thereon. Light having wavelengths of 0.4 to 1.1 microns is absorbed by and converted to electricity by the Si solar cell 10. A GaAs solar cell (upper solar cell) 20 includes an n-type GaAs layer 21 about 2 microns thick and a p-type GaAs layer 22 about 1 micron thick disposed thereon. Light having wavelengths of 0.4 to 0.9 microns is absorbed by and converted to electricity by the GaAs solar cell 20. A buffer layer 30 less than several hundred angstroms thick is inserted between the upper solar cell 20 and the lower solar cell 10, improving the lattice matching of the Si and GaAs crystals. This buffer layer 30 includes a tunnel junction 33 and a high impurity concentration p+-type Ge layer 31 and an n+-type Ge layer 32 sandwiching the tunnel junction.

An n side ohmic contact electrode 1 is disposed on the rear surface of the n-type Si substrate 11. A p side ohmic contact electrode 2 is disposed on part of the front surface of the p-type GaAs layer 22. An anti-reflection film 40 comprising a silicon nitride film having a thickness of 600 to 700 angstroms is disposed on the exposed surface of GaAs layer 22.

Thus, a tandem solar cell device 100 includes the upper solar cell 20, the lower solar cell 10, the buffer layer 30, the anti-reflection film 40, the p side electrode 2, and the n side electrode 1.

In the tandem solar cell device described, light of relatively short wavelengths, i.e., of 0.4 to 0.9 microns, from the solar light spectrum of 0.4 to 2 micron wavelengths which is incident on the device from above is converted into electricity by the upper GaAs solar cell 20, and the light that passes through the upper solar cell 20 is converted into electricity by the lower Si solar cell 10. The charge carriers generated at the respective solar cells 10 and 20 are extracted through the electrodes 1 and 2 as a photocurrent that passes through the thin buffer layer 30 disposed between the two solar cells.

In the prior art tandem solar cell device, the lattice matching buffer layer 30 cuts off light which could be converted to electricity by the lower solar cell 10 and little electricity is produced in the lower solar cell 10.

In more detail, when a plurality of semiconductor layers having different lattice constants are serially disposed, crystalline defects are produced and a semiconductor layer of good crystallinity cannot be obtained. The movement of charge carriers in the semiconductor layer is obstructed by the crystalline defects, thereby decreasing device efficiency. Therefore, in this prior art device, the Ge buffer layer 30 whose crystal lattice constant matches that of GaAs is inserted between the p-type Si layer 12 and the GaAs layer 21, thereby improving the crystallinity of the GaAs. Furthermore, in order to improve the electrical junction between the upper GaAs solar cell 20 and the lower Si solar cell 10, the buffer layer 30 includes a p+-type Ge layer 31 and an n+-type Ge layer 32 containing a high concentration of dopant impurities and a tunnel junction 30a is produced within the buffer layer 30.

The energy band gap of the Ge buffer layer 30 is narrower than that of Si, i.e., the band gap energy of Si is 1.11 eV while that of Ge is 0.66 eV. As a result, light that can be converted into electricity by the Si layer is absorbed by the Ge buffer layer 30 and hardly reaches the Si solar cell 10; that is, the light-to-electricity conversion takes place not in the Si layer having a high light-to-electricity conversion efficiency but in the Ge layer having a low light-to-electricity conversion efficiency. This lowers the light-to-electricity conversion efficiency of the entire device.

SUMMARY OF THE INVENTION

It is an object of the present invention to provide a tandem solar cell device having an upper solar cell with improved crystallinity without reducing the light transmissivity of a buffer layer disposed between the upper and lower solar cells.

It is another object of the present invention to provide a tandem solar cell device having a high efficiency which includes an improved electrical connection between the upper and the lower solar cells.

It is still another object of the present invention to provide a method of producing such a tandem solar cell device.

Other objects and advantages of the present invention will become apparent from the detailed description given hereinafter. It should be understood, however, that the detailed description and specific embodiments are given by way of illustration only, since various changes and modifications within the spirit and scope of the invention will become apparent from the detailed description.

According to an aspect of the present invention, a buffer layer is inserted between an upper solar cell and a lower solar cell of a tandem solar cell device for improved lattice matching of the crystals of the solar cell layers. This buffer layer comprises a semiconductor material having a larger energy band gap than that of a semiconductor material comprising the upper solar cell which enhances the light transmissivity of the buffer layer without adversely affecting the crystallinity of the upper solar cell. Thus, the solar light will not be absorbed by the buffer layer and is effectively converted to electricity by the lower solar cell.

Since a tunnel junction is disposed within the buffer layer, an improved electrical connection is realized between the upper solar cell and the lower solar cell, thereby reducing the resistance loss which would otherwise occur at the junction.

DETAILED DESCRIPTION OF THE PREFERRED EMBODIMENTS

Figure 1:
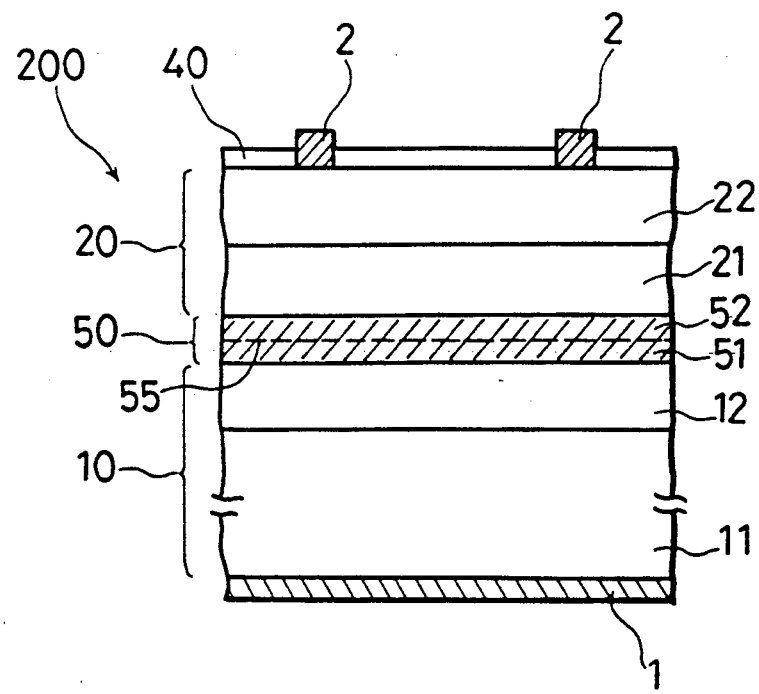
FIG. 1 is a cross-sectional view of a tandem solar cell device according to a first embodiment of the present invention.
Figure 2:
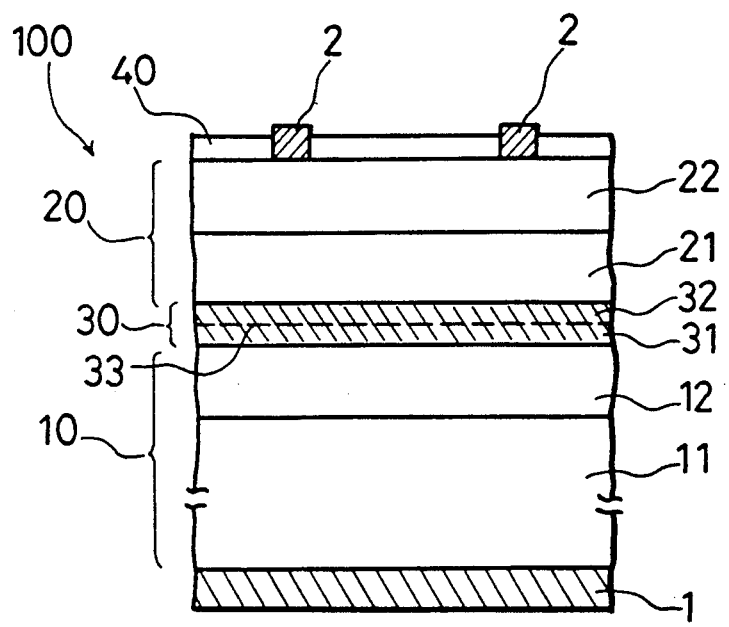
FIG. 2 is a cross-sectional view of a prior art tandem solar cell device.

FIG. 1 is a cross-sectional view of a tandem solar cell device according to a first embodiment of the present invention. In FIG. 1, a tandem solar cell device 200 includes a lower Si solar cell 10 and an upper GaAs solar cell 20 disposed thereon. The lower Si solar cell 10 includes an n-type Si substrate 11 having a resistivity of 2 Ω•cm, a thickness of 200 microns, and a diameter of 3 inches, and a p-type Si diffusion layer 12 having a thickness of 0.15 to 0.3 micron disposed on the Si substrate. A buffer layer 50 of a semiconductor material having a larger band gap energy than that of GaAs comprising the upper solar cell 20 is disposed on the p-type Si layer 12. Herein, ZnSe having a band gap energy of 2.67 eV, larger than the band gap energy of GaAs, i.e., 1.43 eV, is used for the buffer layer. This buffer layer 50 includes a p+-type ZnSe layer 51 and an n+-type ZnSe layer 51 comprising a tunnel junction. The upper solar cell 20 comprising III-V compound semiconductors including GaAs includes an n-type GaAs layer 21 about 1.5 to 3 microns thick and a p-type GaAs layer 22 about 0.5 micron thick. The other elements are the same as those of FIG. 2.

In this embodiment, when light, such as solar light, is incident on the device from above, light of relatively short wavelengths is absorbed by the pn junction of the n-type GaAs layer 21 and the p-type GaAs layer 22, and the light of relatively long wavelengths which has passed through the GaAs layer 20 and the ZnSe buffer layer 50 is converted to electricity by the pn junction of the n-type Si substrate 11 and the p-type Si layer 12. The charge carriers generated at the respective solar cells 20 and 10 are extracted from the n side electrode 1 and the p side electrode 2 as a photocurrent through the ZnSe layer 50.

To construct the tandem solar cell device 200, the surface of the Si substrate 11 is treated with an acid mixture (a solution of sulfuric acid and aqua regia) which is well known as an etchant for Si. Thereafter, a p-type Si diffusion layer 12 having a thickness of 0.15 to 0.3 micron is produced by a thermal diffusion using $BBr_3$ as a diffusion source at a diffusion temperature of 1050° C. and a diffusion time of 40 to 60 minutes.

Next, a p+-type ZnSe layer 51 and an n+-type ZnSe layer 52 having carrier concentrations of about $10^{19}$ cm$^{-3}$ are successively grown to thickness of 500 to 1000 angstroms on the Si substrate 11 by the metal organic chemical vapor deposition (MOCVD) process using dimethylzinc (DMZn) and hydrogen selenide ($H_2Se$) to form the buffer layer 50. The MOCVD temperature is 300° C. and the pressure is 0.4 Torr. The ZnSe layer 50 produces a tunnel junction between the lower Si solar cell 10 and the upper GaAs solar cell 12 which produces an improved electrical connection between the solar cells.

Next, an n-type GaAs layer 21 having a carrier concentration of $1 \times 10^{17}$ cm$^{-3}$ and containing Se or S as a dopant and a p-type GaAs layer 22 having a carrier concentration of $5 \times 10^{18}$ cm$^{-3}$ and containing Zn as a dopant are successively grown on the ZnSe buffer layer 50 to thicknesses of 1.5 to 3 microns and 0.5 microns, respectively, by MOCVD using trimethylgallium (TMGa) and arsine ($AsH_3$) to form the upper solar cell 20. The conditions of this MOCVD process are a growth temperature of 750° C. and a pressure of about 120 Torr.

Thus, the light-to-electricity regions, i.e., the silicon solar cell 10 and the GaAs solar cell 20, are produced. Thereafter, a silicon nitride ($Si_3N_4$) film 40 as an antireflection film is deposited on the p-type GaAs layer 22 to a thickness of 700 to 800 angstroms by a plasma CVD method or by thermal decomposition of silane gas and ammonia gas at 700° C.

Thereafter, a titanium layer, which has good adhesion to semiconductors, is deposited on the rear surface of Si substrate 11 as well as on the front surface of p-type GaAs layer 22 to a thickness of about 500 angstroms by electron beam deposition (MBE) or by sputtering. Subsequently, silver is deposited on the Ti layers to a thickness of several microns by electron beam deposition for connection with the external lead terminals, forming a p side ohmic contact electrode 2 on the p-type GaAs layer 22 and an n side ohmic contact electrode 1 on the n-type Si substrate 11.

In this embodiment, since a ZnSe buffer layer 50 having a larger energy band gap than that of the GaAs layer is inserted between the lower Si solar cell 10 and the upper GaAs solar cell 20, the long wavelength light which can be converted to electricity by the Si layer 10 is not absorbed by the buffer layer 50. Thus, since the ZnSe buffer layer 50 has a band gap energy of 2.67 eV, larger than that of silicon, and is transparent in a long wavelength region, the long wavelength light is incident on the lower solar cell 10 and is converted to electricity with high efficiency.

Since ZnSe matches GaAs in lattice constant, no crystal defects are created during crystal growth of the GaAs layer on the ZnSe buffer layer 50, and a relatively perfect GaAs crystalline structure can be obtained. Therefore, the charge carriers at the upper GaAs solar cell 20 have a higher degree of freedom in their movement, which increases efficiency.

Furthermore, since a tunnel junction 55 is produced inside the ZnSe buffer layer 50, the electrical junction between the lower Si solar cell 10 and the upper GaAs solar cell 20 is improved, thereby reducing the resistance loss which would otherwise occur at the junction. As a result, the light-to-electricity conversion efficiency of the entire device is improved.

In the above-illustrated embodiment, a ZnSe layer having a larger energy band than that of the BaAs layer of the upper solar cell 20 is used, but an AlGaAs layer having a larger band gap energy than that of GaAs may be used.

While in the above-illustrated embodiment the upper solar cell 20, is GaAs, it may be an $Al_xGa_{1-x}As$ ($0 < x > 1$) layer. In this case, a high quality crystal can be produced not only on the AlGaAs buffer layer but also on the ZnSe buffer layer.

Figure 6:
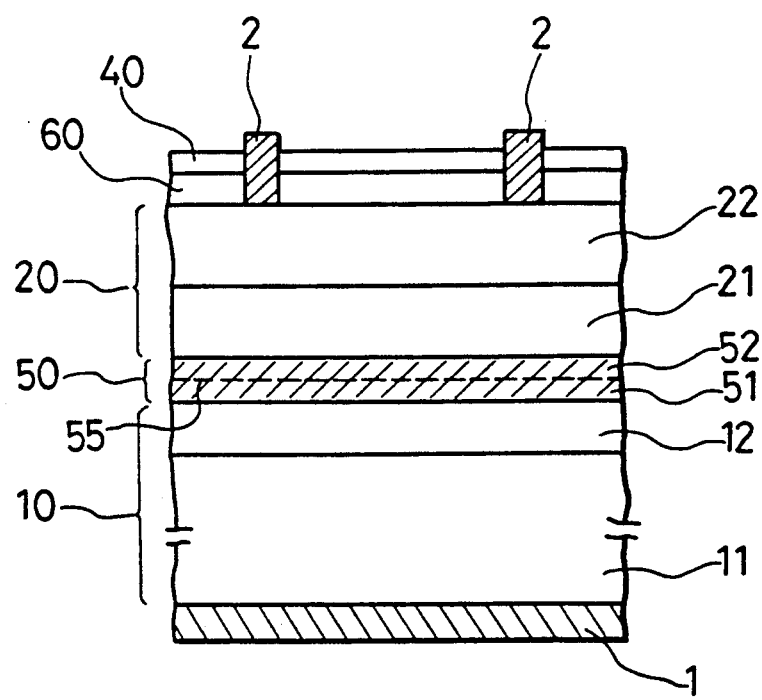
FIG. 6 is a cross-sectional view of a tandem solar cell device which is obtained by providing a window layer in the device of FIG. 1.

As shown in FIG. 6, when a window layer 60 of $Al_xGa_{1-x}As$ (x=0.8 to 0.9) is disposed on the p-type GaAs layer 22 of GaAs solar cell 20, surface recombination due to defects at the surface of the GaAs layer can be reduced. This window layer 60 is grown to a thickness of below 0.1 micron in order to suppress the absorption of short wavelength light therein. This window layer 60 can be produced successively without semiconductor layers using a method similar to the production method for the GaAs cell, that is, MOCVD, MBE, or liquid phase epitaxy (LPE).

While in the above-illustrated embodiment the tandem solar cell device 200 has a single upper solar cell 20, a plurality of light-to-electricity conversion regions may be produced as an upper solar cell. Such a light-to-electricity conversion device having an upper solar cell including a tandem structure is described according to second and third embodiments of the present invention.

Figure 3:
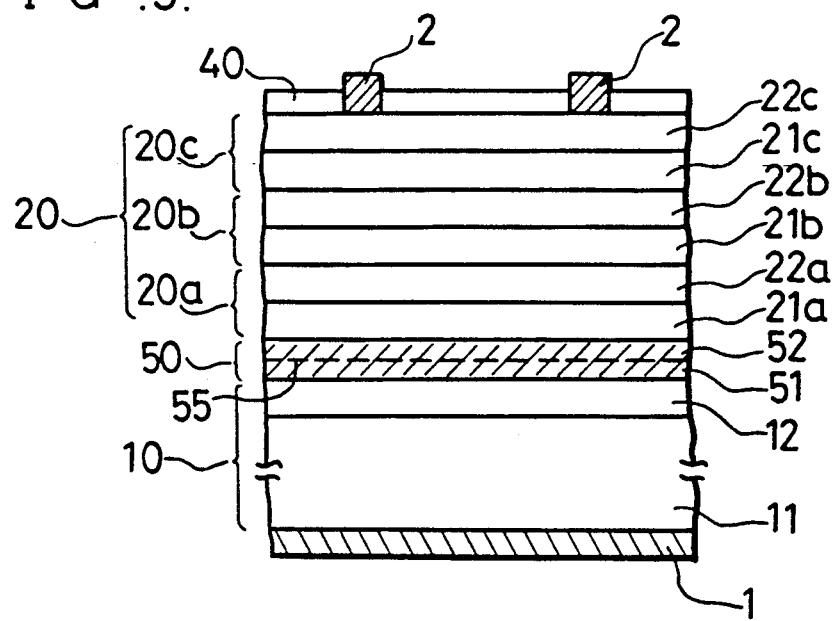
FIG. 3 is a cross-sectional view of a tandem solar cell device according to a second embodiment of the present invention.

FIG. 3 shows a tandem solar cell device according to a second embodiment of the present invention. In FIG. 3, an upper solar cell 20 is obtained by successively depositing first to third $Al_xGa_{1-x}As$ light-to-electricity conversion regions 20a to 20c on a ZnSe buffer layer 50. The farther from the buffer layer 50 the $Al_xGa_{1-x}As$ light-to-electricity conversion region is, the larger the Al composition ratio x is. These regions 20a, 20b, and 20c respectively include p-type $Al_xGa_{1-x}As$ layers 21a, 21b, 21c and n-type $Al_xGa_{1-x}As$ layers 22a, 22b, 22c. The other elements are the same as in FIG. 1.

In this device, in addition to the effects of the above-described first embodiment, the light-to-electricity conversion efficiency of the upper solar cell 20 is enhanced; that is, the solar light which has passed through region 20c or 20b without being absorbed can be absorbed by the lower region 20b or 20a, respectively. Therefore, light-to-electricity conversion can be effectively achieved for the short wavelength components of solar light. Furthermore, the respective light-to-electricity conversion regions can be easily produced by varying the composition ratio of AlGaAs during its growth.

Figure 4:
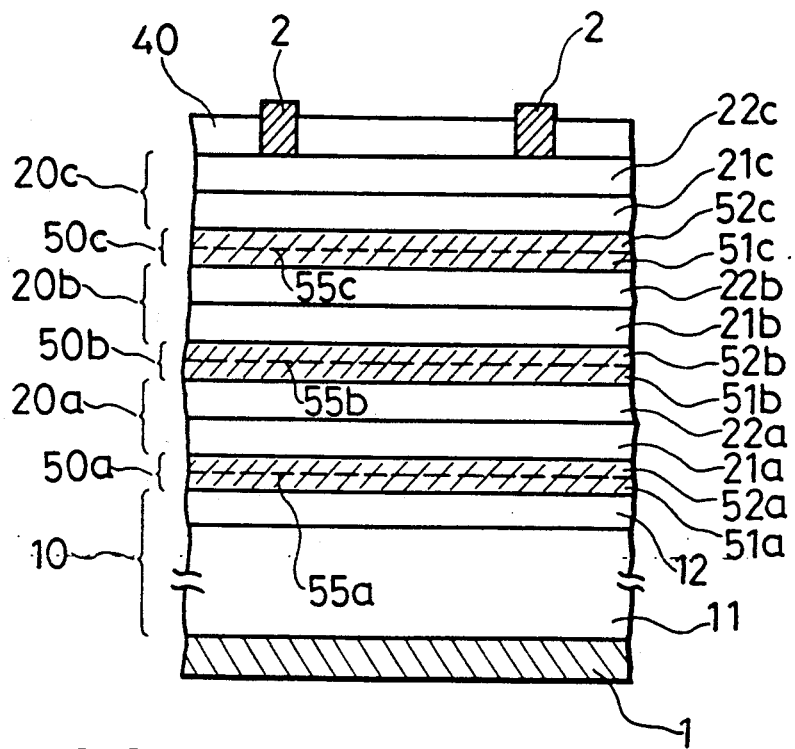
FIG. 4 is a cross-sectional view of a tandem solar cell device according to a third embodiment of the present invention.

FIG. 4 shows a tandem solar cell device according to a third embodiment of the present invention. In this device, in addition to the first ZnSe buffer layer 50 disposed between the lower solar cell 10 and the upper solar cell 20, second and third ZnSe buffer layers 50b and 50c are disposed between the respective light-to-electricity conversion layers of upper solar cell 20. The respective buffer layers 50a to 50c include respective tunnel junctions 55a to 55c including first to third n+-type ZnSe layers 52a to 52c and first to third p+-type ZnSe layers 51a to 51c, respectively. Herein, the buffer layer may comprise AlGaAs instead of ZnSe.

In this embodiment, the electrical junction between the respective light-to-electricity conversion regions can be improved whereby the resistance loss at the junction can be reduced and the light-to-electricity conversion efficiency can be enhanced relative to the second embodiment.

While in the above-described second and third embodiments, the same semiconductor material is used for the multilayer light-to-electricity conversion regions of the upper solar cell, GaAs may be used as the main light-to-electricity conversion region and AlGaAs may be used as the auxiliary light-to-electricity conversion regions.

Figure 5:
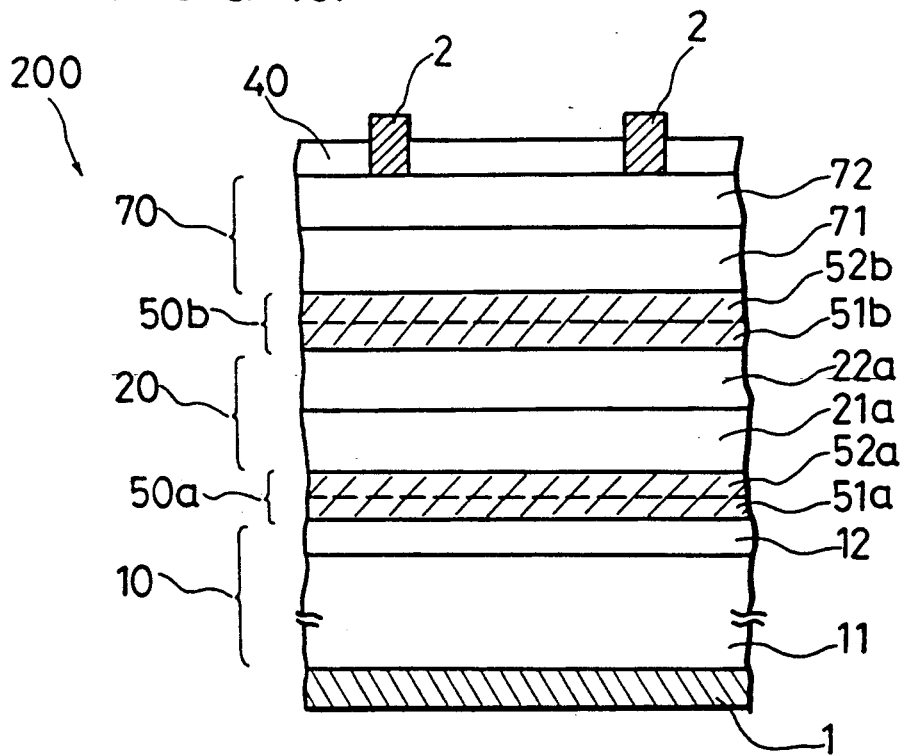
FIG. 5 is a cross-sectional view of a tandem solar cell device according to a fourth embodiment of the present invention.

FIG. 5 shows a tandem solar cell according to a fourth embodiment of the present invention. In FIG. 5, an upper auxiliary AlGaAs solar cell 70 is disposed on the GaAs solar cell 20 with a second buffer layer 50b. The AlGaAs solar cell 70 includes an n-type AlGaAs layer 71 and a p-type AlGaAs layer 72 disposed thereon. The second buffer layer 50b includes a p+-type AlGaAs layer 51b and an n+-type AlGaAs layer 52b. Herein, a p+-type GaAs layer may be used in place of the p+-type AlGaAs layer 51b.

In the upper auxiliary AlGaAs solar cell 70, the range of wavelengths that can be absorbed is increased toward the shorter wavelengths, i.e., to a range of 0.3 to 0.9 micron, compared to a range of 0.4 to 0.9 micron for the upper solar cell 20. Therefore, the natural short wavelength light can be effectively converted to electricity, thereby improving the conversion efficiency. Furthermore, the resistance loss at the electrical junction between the main and auxiliary solar cells can be suppressed.

As is evident from the foregoing description, according to the present invention a buffer layer for lattice matching is inserted between an upper cell and a lower cell of a tandem solar cell device. This buffer layer includes a semiconductor material having a larger band gap energy than that of the semiconductor material in the upper solar cell and includes a tunnel junction. Therefore, the crystallinity of the upper solar cell and the solar light permeability of the buffer layer are improved. Furthermore, since the buffer layer includes a tunnel junction, a good electrical junction between the respective light-to-electricity conversion regions is realized, thereby reducing the resistance loss which would otherwise occur at the respective junctions. As a result, the total light-to-electricity conversion efficiency of the device is improved.

What is claimed is:

1. A tandem solar cell including:
   an upper solar cell for converting relatively short wavelength incident light into electricity, comprising a first crystalline semiconductor having a first lattice constant and first energy band gap;
   an intermediate solar cell for converting relatively long wavelength incident light that has passed through said upper solar cell into electricity, comprising a second crystalline semiconductor having a second energy band gap smaller than the first energy band gap;
   a lower solar cell for converting relatively long wavelength incident light that has passed through said intermediate solar cell into electricity, comprising a third crystalline semiconductor having a third energy band gap smaller than the second energy band gap; and
   crystalline semiconductor buffer layers respectively disposed between said upper and intermediate solar cells and between said intermediate and lower solar cells, each buffer layer having an energy band gap larger than the first energy band gap and a lattice constant approximately the same as the first lattice constant and including a tunneling junction within each of said buffer layers.

2. The tandem solar cell of claim 1 wherein said lower solar cell comprises silicon and said intermediate and upper solar cells comprises a III-V compound semiconductor including Ga and As.

3. The tandem solar cell of claim 2 wherein said upper solar cell comprises $Al_xGa_{1-x}As$.

4. The tandem solar cell of claim 2 including a window layer comprising an $Al_xGa_{1-x}As$ layer, where x is 0.8 to 0.9, disposed on said upper solar cell for receiving incident light.

5. The tandem solar cell of claim 1 wherein at least one of said buffer layers comprises ZnSe.

6. The tandem solar cell of claim 1 wherein at least one of said buffer layers comprises $Al_xGa_{1-x}As$.

7. The tandem solar cell of claim 1 including an antireflection film disposed on said upper solar cell for receiving incident light.

8. The tandem solar cell of claim 1 wherein said intermediate solar cell comprises GaAs and said upper solar cell comprises AlGaAs for receiving and transmitting incident light to said intermediate solar cell.

9. The tandem solar cell of claim 8 wherein said buffer layer between said upper and intermediate solar cells comprises a $p^+$ type AlGaAs layer and an $n^+$ type AlGaAs layer.

* * * * *